US007106615B2

(12) United States Patent
Hoya

(10) Patent No.: US 7,106,615 B2
(45) Date of Patent: Sep. 12, 2006

(54) FERAM CAPABLE OF RESTORING "0" DATA AND "1" DATA AT A TIME

(75) Inventor: Katsuhiko Hoya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 12 days.

(21) Appl. No.: 10/888,978

(22) Filed: Jul. 13, 2004

(65) Prior Publication Data
US 2005/0226027 A1 Oct. 13, 2005

(30) Foreign Application Priority Data
Apr. 9, 2004 (JP) ............................. 2004-115699

(51) Int. Cl.
*G11C 11/22* (2006.01)
(52) U.S. Cl. ................... 365/145; 365/65; 365/149; 365/63; 365/117
(58) Field of Classification Search ................ 365/145, 365/65, 149, 63, 189.01, 117
See application file for complete search history.

(56) References Cited

U.S. PATENT DOCUMENTS

| 4,853,893 | A | * | 8/1989 | Eaton et al. | ................. | 365/145 |
| 5,550,770 | A | * | 8/1996 | Kuroda | ........................ | 365/145 |
| 6,151,242 | A | * | 11/2000 | Takashima | ................... | 365/145 |
| 6,366,490 | B1 | * | 4/2002 | Takeuchi et al. | ............ | 365/145 |
| 6,385,077 | B1 | * | 5/2002 | Kuo et al. | ................... | 365/145 |
| 6,510,071 | B1 | * | 1/2003 | Oowaki | ........................ | 365/145 |
| 6,510,072 | B1 | * | 1/2003 | Kang | .......................... | 365/145 |
| 6,657,883 | B1 | * | 12/2003 | Takashima | ................... | 365/145 |
| 6,707,704 | B1 | * | 3/2004 | Kato et al. | ................... | 365/145 |
| 6,873,536 | B1 | * | 3/2005 | Komatsuzaki | ............... | 365/145 |
| 6,934,177 | B1 | * | 8/2005 | Takashima | ................... | 365/145 |
| 2003/0119212 | A1 | * | 6/2003 | Nishihara et al. | .............. | 438/3 |
| 2003/0185042 | A1 | * | 10/2003 | Kato et al. | ................... | 365/145 |

FOREIGN PATENT DOCUMENTS

JP 02003228977 A * 8/2003

OTHER PUBLICATIONS

D. Takashima, et al., "High-Density Chain Ferroelectric Randsom-Access Memory (CFRAM)", Symposium on VLSI Circuits Digest of Technical Papers, 1997, pp. 83-84.

* cited by examiner

*Primary Examiner*—Viet Q. Nguyen
(74) *Attorney, Agent, or Firm*—Oblon, Spivak, McClelland, Maier & Neustadt, P.C.

(57) ABSTRACT

A semiconductor memory device includes a first memory cell block that has one end connected to the first bit line and the other end connected to a common node, the first memory cell block including a plurality of series-connected unit cells, and a second memory cell block that has one end connected to the second bit line which is complementary to the first bit line and the other end connected to the common node, the second memory cell block including a plurality of series-connected unit cells. When data is restored in a selected unit cell, a potential corresponding to the first bit line is applied to one end of the selected unit cell and a complementary potential corresponding to the second bit line is applied to the other end of the selected unit cell via the common node.

7 Claims, 7 Drawing Sheets

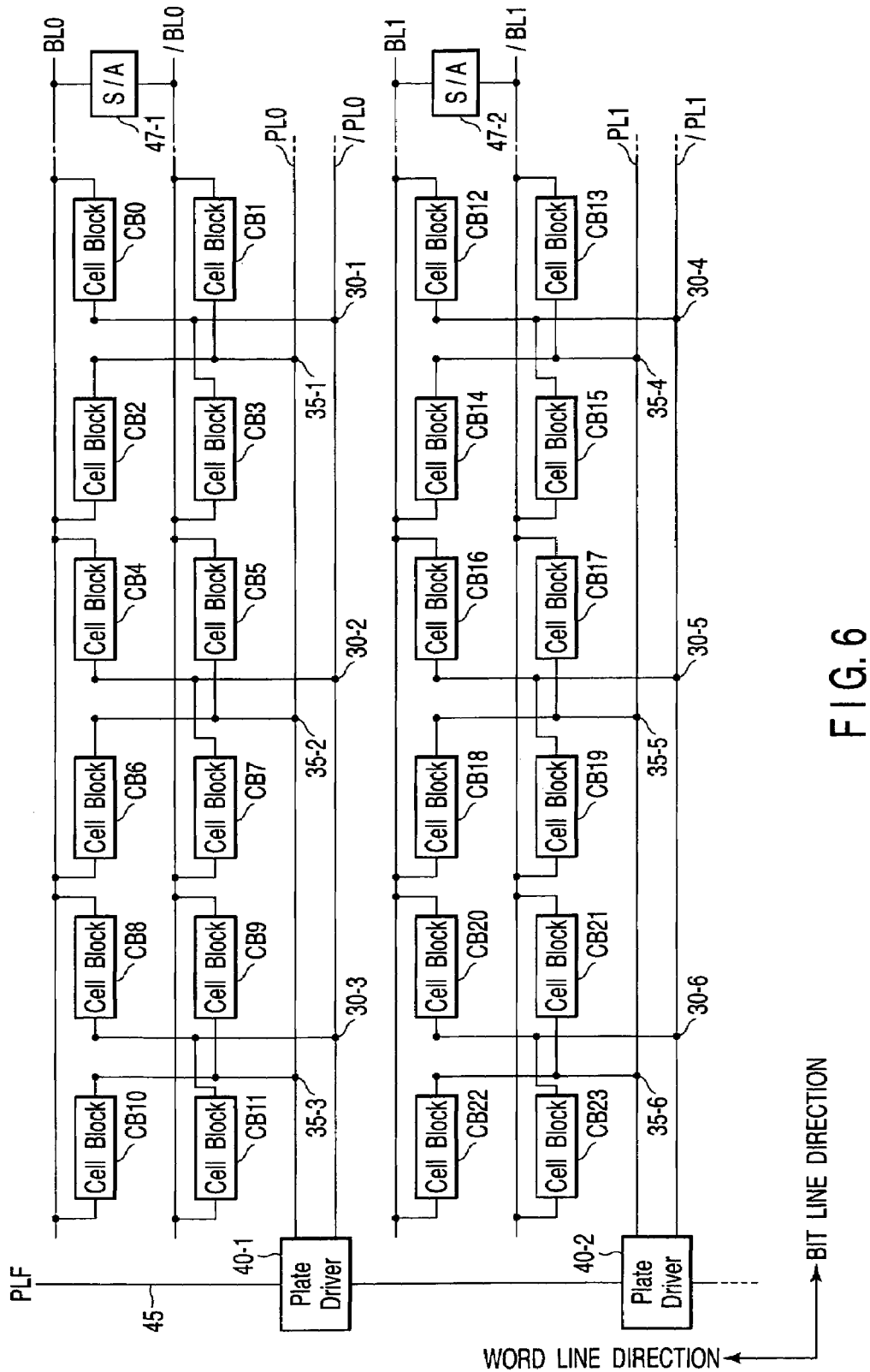
F I G. 6

FERAM CAPABLE OF RESTORING "0" DATA AND "1" DATA AT A TIME

CROSS-REFERENCE TO RELATED APPLICATIONS

This application is based upon and claims the benefit of priority from prior Japanese Patent Application No. 2004-115699, filed Apr. 9, 2004, the entire contents of which are incorporated herein by reference.

BACKGROUND OF THE INVENTION

1. Field of the Invention

The present invention relates generally to a semiconductor memory device, and more particularly to a ferroelectric random access memory (FeRAM).

2. Description of the Related Art

A ferroelectric random access memory (FeRAM) stores binary data in a nonvolatile state on the basis of magnitudes of two different polarization modes, making use of the fact that spontaneous polarization, which is one of features of a ferroelectric substance, exhibits a hysteresis characteristic. For instance, D. Takashima et al., "High-Density Chain Ferroelectric Random Memory (CFRAM)" in proc. VLSI Symp., June 1997, pp. 83–84, discloses, in FIG. 4(a), an example of a so-called 2T2C type TC parallel-unit series-connected ferroelectric memory.

As is illustrated in a timing chart of FIG. 4(b) of the above document, when a rewrite (i.e. restore) operation is executed in the FeRAM, the potentials of a pair of plate lines PL and /PL are changed to "H" level and "L" level at each time of data restore. Specifically, as regards a unit cell that stores "0" data, the plate line /PL is once turned off and then an "H" level potential is applied to the plate line PL. As regards a unit cell that stores "1" data, the plate line PL is once turned off, and then an "L" level potential needs to be applied once again to the plate line /PL. Consequently, voltages cannot be applied at a time to the unit cell that stores "0" data and the unit cell that stores "1" data, leading to an increase in restore time.

BRIEF SUMMARY OF THE INVENTION

According to an aspect of the present invention, there is provided a semiconductor memory device comprising: a first memory cell block that is provided at an intersection between a first bit line and a first word line group and has one end connected to the first bit line and the other end connected to a common node, the first memory cell block including a plurality of series-connected unit cells; and a second memory cell block that is provided at an intersection between a second bit line, which is complementary to the first bit line, and a second word line group and has one end connected to the second bit line and the other end connected to the common node, the second memory cell block including a plurality of series-connected unit cells, wherein when data restore is executed in a selected one of the unit cells, a potential corresponding to the first bit line is applied to one end of the selected unit cell and a complementary potential corresponding to the second bit line is applied to the other end of the selected unit cell via the common node.

According to another aspect of the present invention, there is provided a semiconductor memory device comprising: a first memory cell block that is provided at an intersection between a first bit line and a first word line group and has one end connected to the first bit line and the other end connected to a first common node, the first memory cell block including a plurality of series-connected unit cells; a second memory cell block that is provided at an intersection between a second bit line, which is complementary to the first bit line, and a second word line group and has one end connected to the second bit line and the other end connected to the first common node, the second memory cell block including a plurality of series-connected unit cells; a third memory cell block that is provided at an intersection between the second bit line and the first word line group and has one end connected to the second bit line and the other end connected to a second common node, the third memory cell block and the first memory cell block being paired to form memory cells, and the third memory cell block including a plurality of series-connected unit cells; and a fourth memory cell block that is provided at an intersection between the first bit line and the second word line group and has one end connected to the first bit line and the other end connected to the second common node, the fourth memory cell block and the second memory cell block being paired to form memory cells, and the fourth memory cell block including a plurality of series-connected unit cells, wherein when data restore is executed in a selected one of the memory cells of the first memory cell block and the third memory cell block, a potential corresponding to the first bit line is applied to one end of the unit cell in the first memory cell block and a complementary potential corresponding to the second bit line is applied to the other end of the unit cell via the first common node, and a potential corresponding to the second bit line is applied to one end of the unit cell in the third memory cell block and a complementary potential corresponding to the first bit line is applied to the other end of the unit cell via the second common node, whereby "1" data and "0" data are restored in the memory cell at a time.

According to still another aspect of the present invention, there is provided a semiconductor memory device including a memory cell array wherein a plurality of memory cell blocks are arrayed, the plurality of memory cell blocks including a first memory cell block having one end connected to a first bit line and the other end connected to a common node, and a second memory cell block having one end connected to a second bit line, which is complementary to the first bit line, and the other end connected to the common node, the semiconductor memory device comprising: a plate line connected to the common node; and a plate line drive circuit that has one end connected to the plate line and is selected by a signal line, the plate line drive circuit setting the plate line in a floating state when a select signal is input to the signal line.

BRIEF DESCRIPTION OF THE SEVERAL VIEWS OF THE DRAWING

FIG. 6 is a circuit diagram that schematically shows a semiconductor memory device according to a fourth embodiment of the present invention;

DETAILED DESCRIPTION OF THE INVENTION

Figure 1:
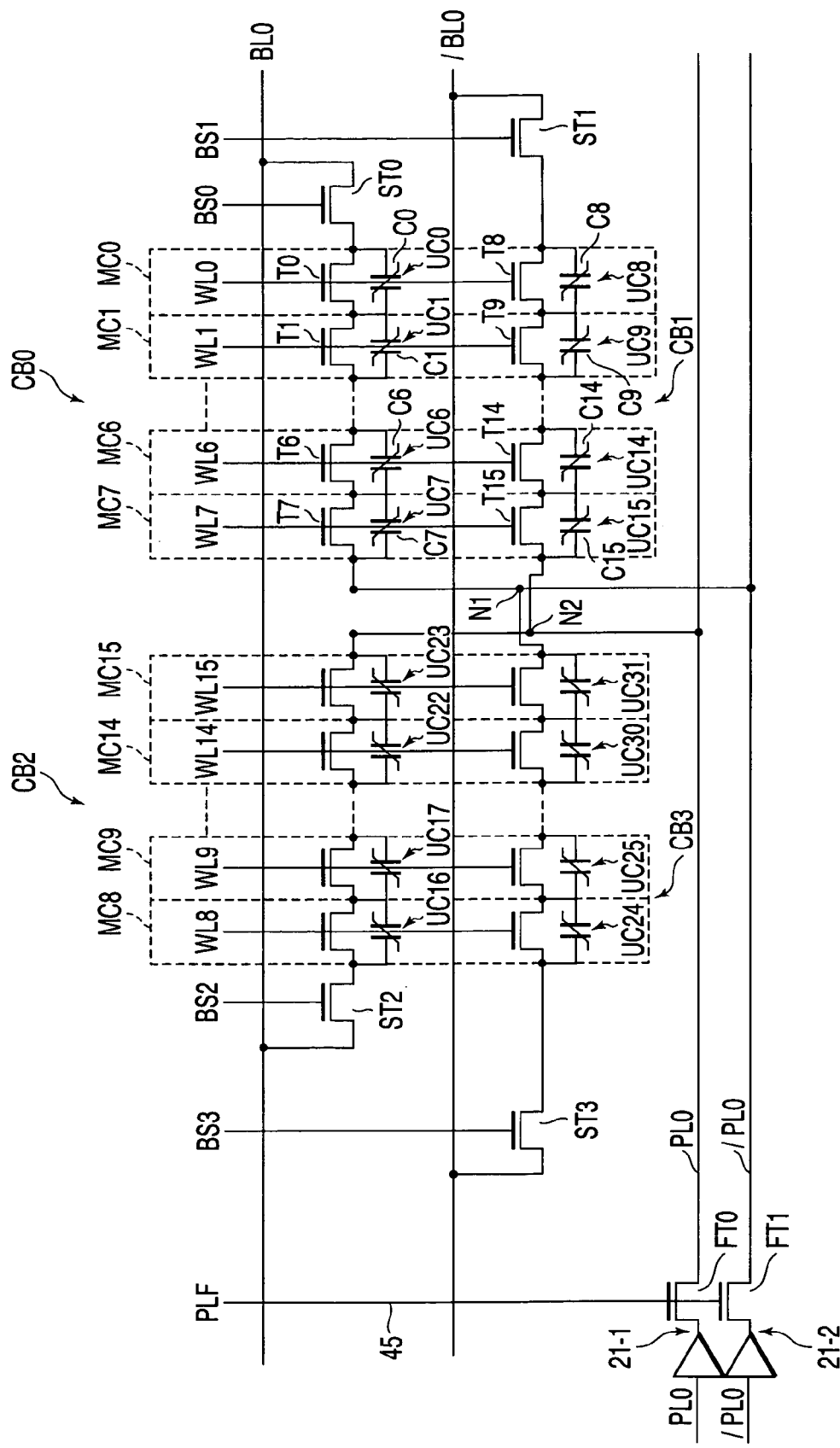
FIG. 1 is a circuit diagram that schematically shows a semiconductor memory device according to a first embodiment of the present invention.

Embodiments of the present invention will now be described with reference to the accompanying drawings. In the descriptions below, common parts are denoted by like reference numerals throughout the drawings.

First Embodiment

Figure 2:
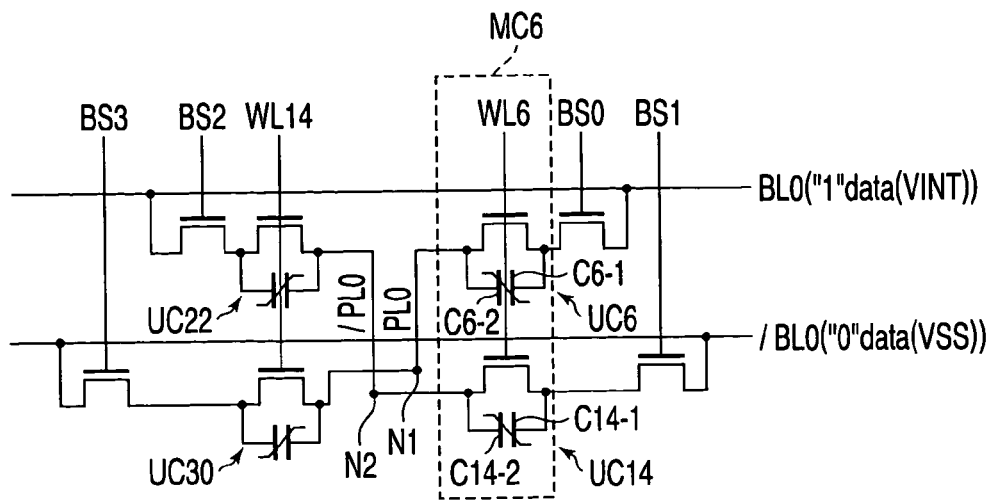
FIG. 2 is a circuit diagram that schematically shows the device of FIG. 1, for illustration of a data restore operation of the semiconductor memory device according to the first embodiment of the invention.
Figure 3:
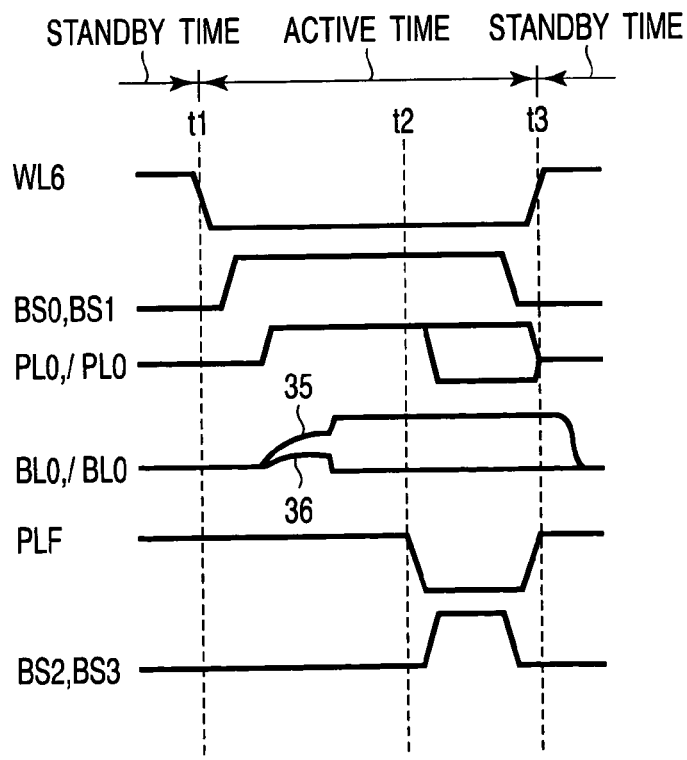
FIG. 3 is a timing chart that schematically illustrates the operation of the semiconductor memory device according to the first embodiment of the invention.

A semiconductor memory device according to a first embodiment of the present invention is described referring to FIG. 1 to FIG. 3. FIG. 1 shows an example of the semiconductor memory device according to the first embodiment. That is, FIG. 1 is a circuit diagram that schematically shows a so-called 2T2C type parallel-unit series-connected ferroelectric memory.

In the embodiment to be described below, a 2T2C type parallel-unit series-connected ferroelectric memory is described by way of example. In the 2T2C type parallel-unit series-connected ferroelectric memory, a pair of 1T1C unit cells are combined to constitute a single memory cell MC, and thus 1-bit data is determined. Mutually complementary data ("0" data and "1" data) are written in the ferroelectric capacitors C of the paired 1T1C unit cells. In a data read operation of the ferroelectric memory, signals from the two ferroelectric capacitors, which are mutually complementary data, are compared and amplified by a sense amplifier. Data is determined on the basis of the difference between the signals.

Cell blocks CB0 to CB3 are provided at intersections between a pair of bit lines BL0 and /BL0 and a plurality of word line groups WL0 to WL7, WL8 to WL15.

One end of the cell block CB0 is connected to a common node N1 and thus connected to one end of an adjacent cell block CB3. The other end of the cell block CB0 is connected to the bit line BL0. One end of the cell block CB1 is connected to a common node N2 and thus connected to one end of an adjacent cell block CB2. The other end of the cell block CB1 is connected to the bit line /BL0. The other end of the cell block CB2 is connected to the bit line BL0. The other end of the cell block CB3 is connected to the bit line /BL0. A plate line /PL0 is connected to the common node N1, and a plate line PL0 is connected to the common node N2.

The cell blocks CB0 and CB3, which are mutually connected at one end to the common node N1, have the other ends connected to the bit lines BL0 and /BL0, respectively. The cell blocks CB1 and CB2, which are mutually connected at one end to the common node N2, have the other ends connected to the bit lines /BL0 and BL0, respectively. In other words, the cell blocks, which are connected at one end to the same common node, have the other ends connected to the mutually complementary bit lines BL0 and /BL0.

Similarly, the cell blocks CB0 and CB3, which are commonly connected at one end to the plate line /PL0, have the other ends connected to the bit lines BL0 and /BL0, respectively. The cell blocks CB1 and CB2, which are commonly connected at one end to the plate line PL0, have the other ends connected to the bit lines /BL0 and BL0, respectively. In other words, the cell blocks, which are connected at one end to the same plate line, have the other ends connected to the mutually complementary bit lines BL0 and /BL0.

The cell blocks CB0 to CB3 include a plurality of unit cells UC0 to UC31 and block select transistors ST0 to ST3. For example, the unit cells UC0 to UC7 of the cell block CB0 include cell transistors T0 to T7 and ferroelectric capacitors C0 to C7, respectively. One end of each cell transistor, T0 to T7, is connected to one electrode of each ferroelectric capacitor, C0 to C7. The other end of each cell transistor, T0 to T7, is connected to the other electrode of each ferroelectric capacitor, C0 to C7. The gate of each cell transistor, T0 to T7, is connected to the associated word line, WL0 to WL7. The unit cells UC0 to UC7 (eight in total) are connected in series at one end and the other end thereof. The cell transistor T0 is connected at the other end to one end of the block select transistor ST0, and the cell transistor T7 is connected at one end to the plate line /PL0. A block select signal BS0 is input to the gate of the block select transistor ST0, and the block select transistor ST0 is connected at the other end to the bit line BL0. Each of the cell blocks CB1 to CB3 has the same configuration as described above.

For example, the unit cells UC0 and UC8, whose gates are connected to the same word line WL0, constitute a memory cell MC0, and mutually complementary cell data ("0" data and "1" data) are rewritten in the ferroelectric capacitors C0 and C8 of the unit cells UC0 and UC8. The same configuration applies to the memory cells MC1 to MC15.

A transistor FT0 is provided as a plate line drive circuit 21-1. A select signal PLF is input to the gate of the transistor FT0 via a signal line 45. A signal corresponding to a potential of the plate line PL0 is input to one end of the current path of the transistor FT0, and the other end of the current path is connected to the plate line PL0. A transistor FT1 is provided as a plate line drive circuit 21-2. The select signal PLF is input to the gate of the transistor FT1 via the signal line 45. A signal corresponding to a potential of the plate line /PL0 is input to one end of the current path of the transistor FT1, and the other end of the current path is connected to the plate line /PL0.

Next, with reference to FIG. 2 and FIG. 3, the read operation scheme of the semiconductor memory device according the embodiment is described, taking the ferroelectric memory shown in FIG. 1 by way of example. FIG. 2 is a schematic circuit diagram for explaining the read operation of the semiconductor memory device according to the embodiment. FIG. 3 is a timing chart that illustrates the read operation of the unit cell UC6 shown in FIG. 1. In the description below, the operation of the unit cell UC6 that is selected by the word line WL6 in FIG. 1 is explained as a representative example.

As is illustrated in FIG. 3, prior to time t1 (standby time), a potential VPP ("H" level) is applied to all word lines WL0 to WL15, and this potential is maintained. Accordingly, the transistors T0 to T24 in all unit cells UC0 to UC24 are turned on, and no potential is applied to the electrodes of each ferroelectric capacitor, C0 to C24. The block select signals BS0, BS1, BS2 and BS3 and the paired bit lines BL0 and /BL0 are maintained at a potential VSS ("L" level). A potential VPLL ("L" level) is applied to the paired plate lines PL0 and /PL0 and this potential is maintained.

Subsequently, at the time t1, the paired bit lines BL0 and /BL0 are set in the floating state, and thereby an active time begins. Then, the level of the word line WL6 is lowered to VSS ("L" level), thus turning off the transistor T6. Further, the level of each block select signal BS0, BS1, is raised to VPP ("H" level), thereby turning on the block select transistors ST0 and ST1. Thus, a current path between one of the electrodes of each ferroelectric, capacitor C0, C1 and the associated bit line BL0, /BL0 is rendered conductive. The level of the plate line PL0, /PL0, which is connected to the other electrode of each ferroelectric capacitor C0, C1 is raised from the VPLL ("L" level) to VINT ("H" level). Consequently, cell data ("1" data) of one of the capacitors C0 and C1 is read out to the bit line BL0, and the other complementary cell data ("0" data) is read out to the bit line /BL0. Thereafter, the potential of the cell data and that of the complementary cell data are compared and the comparison result is amplified. Thus, the read operation of the unit cell UC6 is completed.

At a time t2, the level of the select signal PLF is lowered to VSS, thereby turning off the transistors FT0 and FT1 and separating the plate line drive circuits 21-1 and 21-2 from the plate lines PL0 and /PL0. Thus, the plate lines PL0 and PL1 are floated. Following this, the gate potential of the block select transistor ST2, ST3 is raised to VPP, thereby turning on the block select transistor ST2, ST3.

By turning on the block select transistor ST2, ST3, the potential VINT ("H" level) corresponding to the bit line BL0 is applied to one electrode C6-1 of the ferroelectric capacitor C6 of the unit cell UC6, as shown in FIG. 2 (FIG. 2 does not show all unit cells). The potential VSS ("L" level) corresponding to the bit line /BL0 is applied to the other electrode C6-2 on the plate line PL0 side via the common node N1 and the on-state unit cells UC24 to UC31. Thus, a "0" rewrite operation ("0" restore operation) is executed.

At the same time, the potential VSS ("L" level) corresponding to the bit line /BL0 is applied to one electrode C14-1 of the ferroelectric capacitor C14 of unit cell UC14, and the potential VINT ("H" level) corresponding to the bit line BL0 is applied to the other electrode C14-2 on the plate line /PL0 side via the common node N2 and the on-state unit cells UC16 to UC22. Thus, a "1" rewrite operation ("1" restore operation) is executed. As stated above, the restore operations for the unit cells UC6 and UC14 are executed at a time, and the restore operation of the memory cell MC6 is completed.

At time t3, the potential that is applied to the gates of block select transistors ST0 to ST3 is lowered to VSS, thus turning off the block select transistors ST0 to ST3. Further, the select signal PLF is raised to VINT, thus turning on the transistors FT0 and FT1. Then, the potential that is applied to the word line WL6 is activated to the level VPP, thus turning on the unit cells UC6 and UC14. Further, the potential that is applied to the paired plate lines PL0 and /PL0 are set at VPLL, and thus the memory device is restored to the standby state.

As has been described above, the semiconductor memory device according to the embodiment is the 2T2C type parallel-unit series-connected ferroelectric memory, which includes the memory cell blocks CB0 to CB3 that are arranged adjacent to each other in the direction of the bit line pair BL0, /BL0. One end of the memory cell block CB0 and one end of the memory cell block CB3, which do not constitute the memory cells MC, are connected to each other to the common node N1. One end of the memory cell block CB1 and one end of the memory cell block CB2, which do not constitute the memory cells MC, are connected to each other to the common node N2.

Hence, at the time of the restore operation (time t2), potentials corresponding to the complementary bit lines BL0 and /BL0 can be applied at the same time via the common nodes (N1, N2) to the two unit cells UC that constitute the memory cell MC. As a result, complementary "0" data and "1" data can be restored in the two unit cells UC that constitute the memory cell MC. Therefore, the restore time can be shortened, and also the restore cycle can be shortened.

Furthermore, the plate lines PL0 and /PL0 are connected to the common nodes N2 and N1, respectively. Thus, the plate line PL0, /PL0, transistor FT0, FT1, and plate line drive circuit 21-1, 21-2 can be shared by the two cell blocks (CB0 & CB3, CB1 & CB2) that are adjacent to each other along the bit lines BL0 and /BL0. As a result, the cell array area in the direction of bit lines BL0 and /BL0 can be reduced, and a higher integration density can be achieved.

At the time of the cell data read operation (time t1), as described above, signals from the two ferroelectric capacitors, in which mutually complementary data are written, are input to the sense amplifier, and data is determined on the basis of a difference between the signals. Therefore, a read-out margin can be doubled, compared to a so-called 1T1C type ferroelectric memory, which determines data on the basis of a difference from a reference potential that is produced from a common dummy memory cell. In short, even if non-uniformity occurs in characteristics of the ferroelectric capacitor C, data can stably be read out and the reliability can be enhanced.

Moreover, since the semiconductor memory device according to the present embodiment is configured to include the ferroelectric memory, the same architecture as that of a DRAM, etc., is applicable, and easy and low-cost manufacture can effectively be achieved.

Second Embodiment

Figure 4:
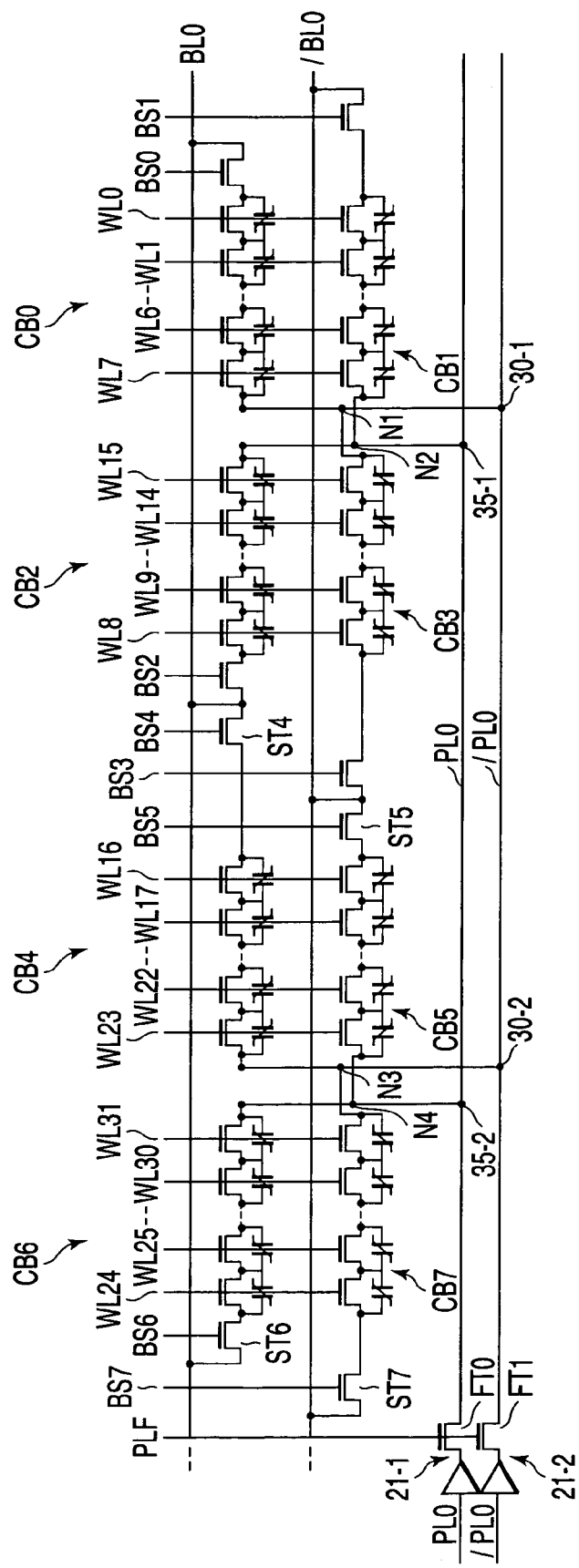
FIG. 4 is a circuit diagram that schematically shows a semiconductor memory device according to a second embodiment of the present invention.

A semiconductor memory device according to a second embodiment of the present invention is described referring to FIG. 4. The description of the parts, which are common to those in the first embodiment, is omitted. FIG. 4 shows an example of the semiconductor memory device according to the second embodiment. That is, FIG. 4 is a circuit diagram that schematically shows a so-called 2T2C type parallel-unit series-connected ferroelectric memory.

In the semiconductor memory device of this embodiment, cell blocks CB4 to CB7 are additionally provided at intersections between the bit lines BL0 and /BL0 and word line groups WL16 to WL23 and WL24 to WL31. Moreover, the plate line PL0 is shared by the cell blocks CB1, CB2, CB5 and CB6. The plate line /PL0 is shared by the cell blocks CB0, CB3, CB4 and CB7.

One end of the cell block CB4 is connected to a common node N3 and thus connected to one end of the adjacent cell block CB7. The other end of the cell block CB4 is connected to the bit line BL0. One end of the cell block CB5 is connected to a common node N4 and thus connected to one end of the adjacent cell block CB6. The other end of the cell block CB5 is connected to the bit line /BL0. The other end of the cell block CB6 is connected to the bit line BL0. The other end of the cell block CB7 is connected to the bit line /BL0. The plate line /PL0 is connected to the common node N3, and the plate line PL0 is connected to the common node N4.

The common nodes N1 and N3 are connected to the plate line /PL0 via two nodes 30-1 and 30-2. The common nodes N2 and N4 are connected to the plate line PL0 via two nodes 35-1 and 35-2.

The unit cell architecture in the cell blocks CB4 to CB7 is the same as that in the first embodiment. In addition, the schemes of the read operation, etc. are the same as those in the first embodiment, so a detailed description is omitted.

According to the above-described structure, the same advantages as with the first embodiment can be obtained. Besides, the common nodes N1 and N3 are connected to the plate line /PL0 via the two nodes 30-1 and 30-2, and the common nodes N2 and N4 are connected to the plate line PL0 via the two nodes 35-1 and 35-2.

Hence, the plate lines PL0 and /PL0 can further be shared with the memory cell blocks CB4 to CB7. Therefore, the cell array area can be reduced, and miniaturization in configuration can effectively be achieved.

Third Embodiment

Figure 5:
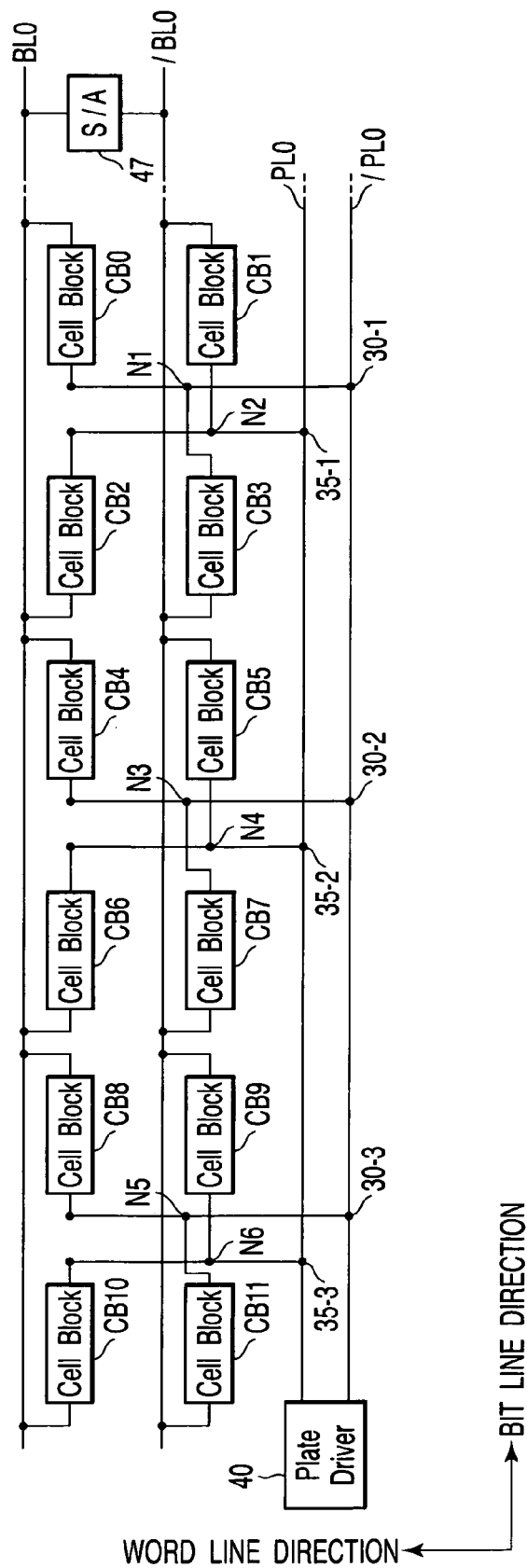
FIG. 5 is a circuit diagram that schematically shows a semiconductor memory device according to a third embodiment of the present invention.

A semiconductor memory device according to a third embodiment of the present invention is described referring to FIG. 5. The description of the parts, which are common to those in the second embodiment, is omitted. FIG. 5 shows an example of the semiconductor memory device according to the third embodiment. That is, FIG. 5 is a circuit diagram that schematically shows a so-called 2T2C type parallel-unit series-connected ferroelectric memory. FIG. 5 omits depiction of detailed circuitry in the memory cell block (CB), word lines WL, etc.

In the semiconductor memory device of this embodiment, cell blocks CB8 to CB11 are additionally provided at intersections between the bit lines BL0 and /BL0 and word line groups (not shown). Compared to the semiconductor memory device of the second embodiment, the plate line PL0 is further shared with the cell blocks CB9 and CB10, and the plate line /PL0 is further shared with the cell blocks CB8 and CB11.

One end of the cell block CB8 is connected to a common node N5 and thus connected to one end of the adjacent cell block CB11. The other end of the cell block CB8 is connected to the bit line BL0. One end of the cell block CB9 is connected to a common node N6 and thus connected to one end of the adjacent cell block CB10. The other end of the cell block CB9 is connected to the bit line /BL0. The other end of the cell block CB10 is connected to the bit line BL0. The other end of the cell block CB11 is connected to the bit line /BL0. The plate line /PL0 is connected to the common node N5 via a node 30-3, and the plate line PL0 is connected to the common node N6 via a node 35-3.

A plate line drive circuit (plate driver) 40 is connected to the plate lines PL0 and /PL0. A sense amplifier (S/A) 47, which has one end connected to the bit line BL0 and the other end connected to the bit line /BL0, is provided.

According to the above-described structure, the same advantages as with the second embodiment can be obtained. Besides, the cell blocks CB8 to CB11 are additionally provided at the intersections between the bit lines BL0 and /BL0 and the word line groups (not shown).

Hence, the plate lines PL0 and /PL0 can further be shared with the memory cell blocks CB8 to CB11. Therefore, the cell array area can be reduced, and miniaturization in configuration can effectively be achieved.

Furthermore, the plate lines PL0 and /PL0 of all memory cell blocks, which are connected to the bit line pair BL0 & /BL0, can be shared. In this case, the cell array area can further be reduced and miniaturization can effectively be achieved.

Fourth Embodiment

A semiconductor memory device according to a fourth embodiment of the present invention is described referring to FIG. 6. The description of the parts, which are common to those in the first embodiment, is omitted. FIG. 6 shows an example of the semiconductor memory device according to the fourth embodiment. That is, FIG. 6 is a circuit diagram that schematically shows a so-called 2T2C type parallel-unit series-connected ferroelectric memory. FIG. 6 omits depiction of detailed circuitry in the memory cell block (CB), word lines WL, etc.

In the semiconductor memory device of this embodiment, the signal line 45, to which the select signal PLF is input, is shared by all the cell blocks CB0 to CB23.

A sense amplifier 47-1, which has one end connected to the bit line BL0 and the other end connected to the bit line /BL0, is provided. In addition, a sense amplifier 47-2, which has one end connected to the bit line BL1 and the other end connected to the bit line /BL1, is provided.

According to the above-described structure, the same advantages as with the third embodiment can be obtained. Besides, since the signal line 45, to which the select signal PLF is input, is shared by all the cell blocks CB0 to CB23, the cell array area can further be reduced and miniaturization in configuration can effectively be achieved.

Fifth Embodiment

Figure 7:
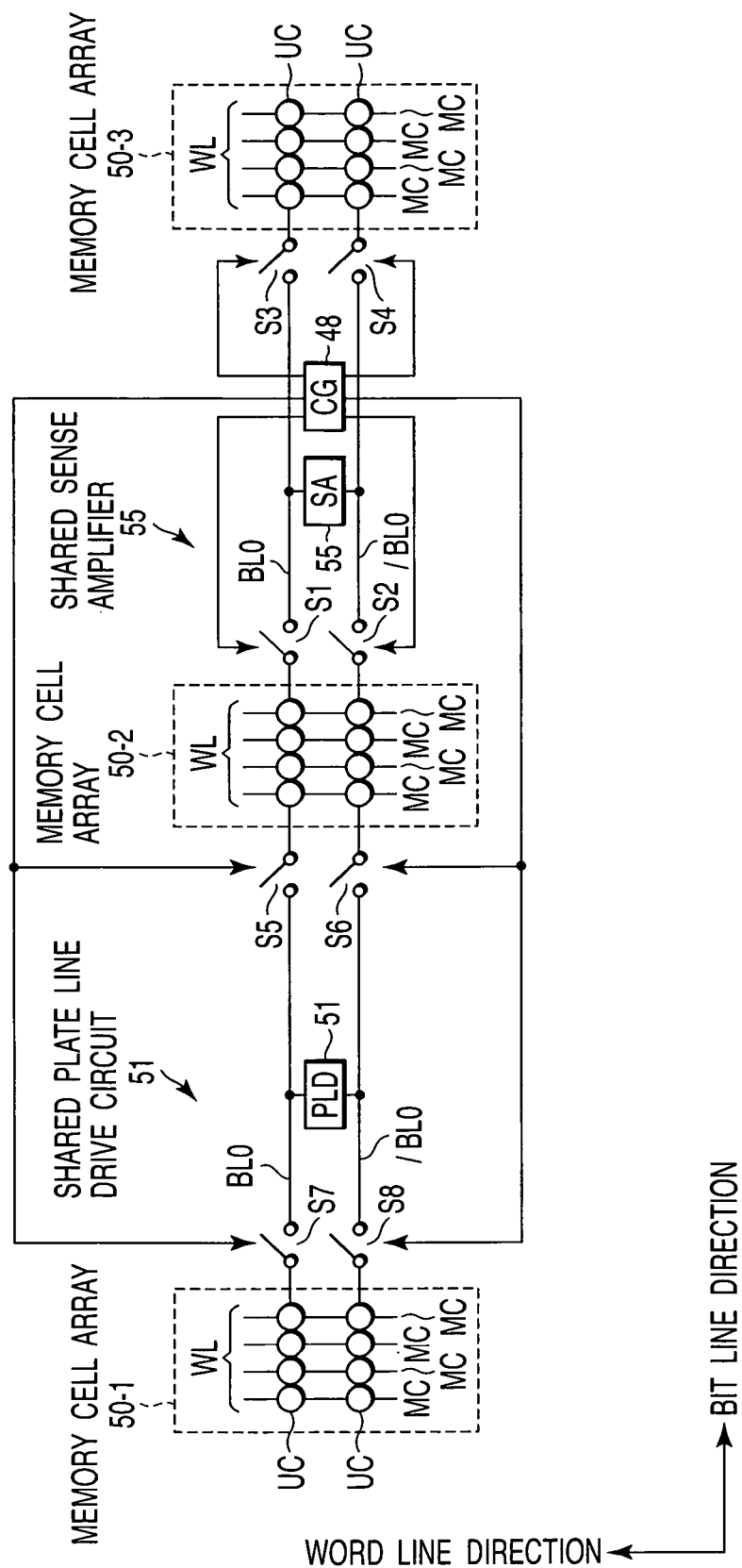
FIG. 7 is a circuit diagram that schematically shows a semiconductor memory device according to a fifth embodiment of the present invention.

A semiconductor memory device according to a fifth embodiment of the present invention is described referring to FIG. 7. The description of the parts, which are common to those in the fourth embodiment, is omitted. FIG. 7 is a circuit diagram that schematically shows the semiconductor memory device of this embodiment.

The semiconductor memory device according this embodiment further includes a shared sense amplifier 55, a shared plate line drive circuit 51 and a control circuit (CG) 48. The shared sense amplifier 55 and shared plate line drive circuit 51 are shared by three cell arrays 50-1, 50-2 and 50-3 that are adjacent to each other in the direction of the bit lines BL0 and /BL0.

The shared sense amplifier (SA) 55 has one end connected to the bit line BL0, and the other end connected to the bit line /BL0 that is complementary to the bit line BL0. The control circuit 48 controls turning on/off of switches S1 to S8.

The shared plate line drive circuit (PLD) 51 has one end connected to the bit line BL0 and the other end connected to the complementary bit line /BL0.

When the sense amplifier 47 compares and amplifies mutually complementary data from the cell array 50-2 in order to determine data (read operation time), the control circuit 48 turns on the switches S1, S2, S5 and S6 and turns off the switches S3, S4, S7 and S8. When the sense amplifier 47 compares and amplifies mutually complementary data from the cell array 50-1 in order to determine data, the control circuit 48 turns on the switches S7 and S8 and turns off the switches S5 and S6. When the sense amplifier 47 compares and amplifies mutually complementary data from the cell array 50-3 in order to determine data, the control circuit 48 turns on the switches S3 and S4 and turns off the switches S1 and S2.

In a possible configuration of the cell array 50-2, one end of each bit line BL0, /BL0 of the semiconductor memory device shown in FIG. 5 is connected to the shared sense amplifier 55 via the switch S1, S2, and the other end of each bit line BL0, /BL0 is connected to the shared plate line drive circuit 51 via the switch S5, S6.

According to the above-described configuration, the same advantages as with the fourth embodiment can be obtained. Besides, the shared sense amplifier 55 and shared plate line drive circuit 51 are shared by the cell arrays 50-1, 50-2 and 50-3 that are adjacent to each other in the direction of the bit lines BL0 and /BL0.

Therefore, the cell array area in the word line WL direction can further be reduced and miniaturization in configuration can effectively be achieved.

Sixth Embodiment

Figure 8:
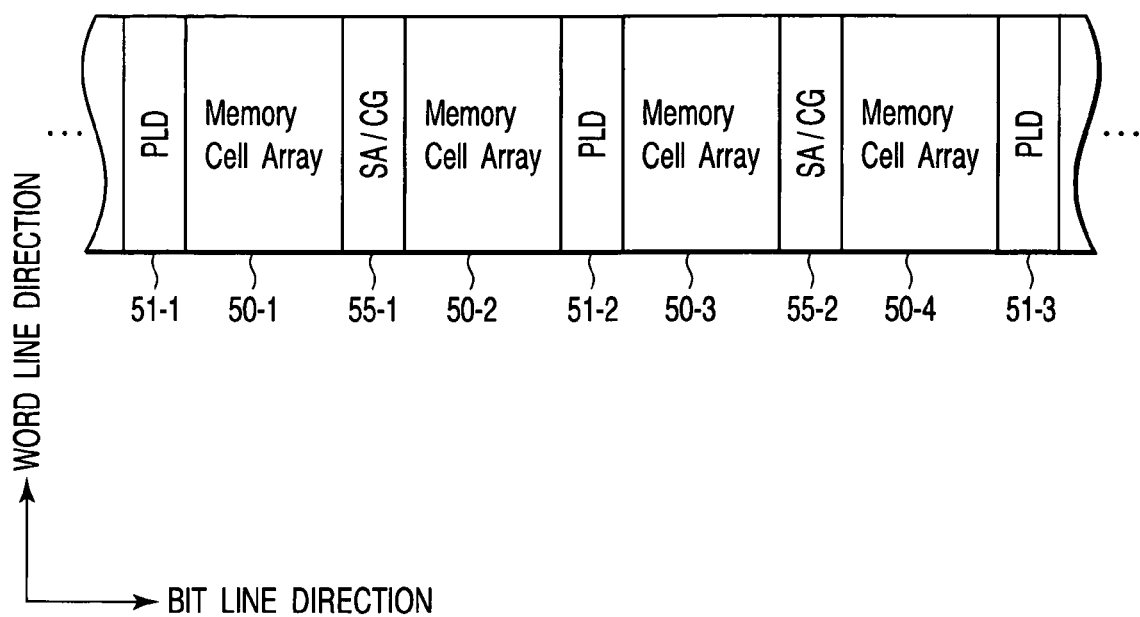
FIG. 8 is a block diagram that schematically shows a semiconductor memory device according to a sixth embodiment of the present invention.

A semiconductor memory device according to a sixth embodiment of the present invention is described referring to FIG. 8. The description of the parts, which are common to those in the fifth embodiment, is omitted. FIG. 8 is a block diagram that schematically shows the semiconductor memory device of this embodiment. In the semiconductor memory device according this embodiment, shared sense amplifiers 55 and shared plate line drive circuits 51 are shared by a plurality of memory cell arrays that are arranged in the bit line direction.

According to the semiconductor memory device of this embodiment, a plurality of memory cell arrays 50-1 to 50-4, which are arranged in the bit line direction, commonly use shared plate line drive circuits 51-1 to 51-3 and shared sense amplifiers 55-1 and 55-2.

According to the above-described structure, the same advantages as with the fifth embodiment can be obtained. Besides, the memory cell arrays 50-1 to 50-4, which are adjacent to each other in the bit line direction, commonly use the shared plate line drive circuits 51-1 to 51-3 and the shared sense amplifiers 55-1 and 55-2. Therefore, the cell array area in the word line direction can further be reduced and miniaturization in configuration can effectively be achieved.

As has been described above, according to the semiconductor memory devices of the first to sixth embodiments of the invention, "0" data and "1" data can be restored at a time in the semiconductor memory device including the 2T2C type parallel-unit series-connected ferroelectric memory. Therefore, the data restore time can be shortened, and also the cycle time can be shortened.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a first memory cell block that is provided at an intersection between a first bit line and a first word line group and has one end connected to the first bit line and the other end connected to a common node, the first memory cell block including a plurality of series-connected unit cells;
a second memory cell block that is provided at an intersection between a second bit line, which is complementary to the first bit line, and a second word line group and has one end connected to the second bit line and the other end connected to the common node, the second memory cell block including a plurality of series-connected unit cells;
a plate line that is connected to the common node; and
a plate line drive circuit that is connected to the plate, the plate line drive circuit setting the plate line in a floating state when data restore is executed in the unit cell;
wherein when data restore is executed in a selected one of the unit cells, a potential corresponding to the first bit line is applied to one end of the selected unit cell and a complementary potential corresponding to the second bit line is applied to the other end of the selected unit cell via the common node.

2. A semiconductor memory device comprising:
a first memory cell block that is provided at an intersection between a first bit line and a first word line group and has one end connected to the first bit line and the other end connected to a first common node, the first memory cell block including a plurality of series-connected unit cells;
a second memory cell block that is provided at an intersection between a second bit line, which is complementary to the first bit line, and a second word line group and has one end connected to the second bit line and the other end connected to the first common node, the second memory cell block including a plurality of series-connected unit cells;
a third memory cell block that is provided at an intersection between the second bit line and the first word line group and has one end connected to the second bit line and the other end connected to a second common node, the third memory cell block and the first memory cell block being paired to form memory cells, and the third memory cell block including a plurality of series-connected unit cells; and
a fourth memory cell block that is provided at an intersection between the first bit line and the second word line group and has one end connected to the first bit line and the other end connected to the second common node, the fourth memory cell block and the second memory cell block being paired to form memory cells, and the fourth memory cell block including a plurality of series-connected unit cells,
wherein when data restore is executed in a selected one of the memory cells of the first memory cell block and the third memory cell block, a potential corresponding to the first bit line is applied to one end of the unit cell in the first memory cell block and a complementary potential corresponding to the second bit line is applied to the other end of the unit cell via the first common node, and a potential corresponding to the second bit line is applied to one end of the unit cell in the third memory cell block and a complementary potential corresponding to the first bit line is applied to the other end of the unit cell via the second common node, whereby "1" data and "0" data are restored in the memory cell at a time.

3. The semiconductor memory device according to claim 2, further comprising:

a first plate line that is connected to the first common node;

a first plate line drive circuit that is connected to the first plate line;

a second plate line that is connected to the second common node; and a second plate line drive circuit that is connected to the second plate line, wherein the first plate line drive circuit sets the first plate line in a floating state when data restore is executed in the selected unit cell, and the second plate line drive circuit sets the second plate line in a floating state when data restore is executed in the selected unit cell.

4. The semiconductor memory device according to claim 1, wherein the first memory cell block includes a first block select transistor having a drain connected to one end of the first memory cell block, a source connected to the first bit line, and a gate connected to a block select signal line, and the second memory cell block includes a second block select transistor having a drain connected to one end of the second memory cell block, a source connected to the second bit line, and a gate connected to a block select signal line.

5. The semiconductor memory device according to claim 1, wherein each of said plurality of unit cells comprises:

a ferroelectric capacitor with two electrodes; and a transistor having a source connected to one of the electrodes of the ferroelectric capacitor, a drain connected to the other of the electrodes of the ferroelectric capacitor, and a gate connected to an associated one of word lines that are included in the word line group.

6. The semiconductor memory device according to claim 2, wherein the first memory cell block includes a first block select transistor having a drain connected to one end of the first memory cell block, a source connected to the first bit line, and a gate connected to a block select signal line, the second memory cell block includes a second block select transistor having a drain connected to one end of the second memory cell block, a source connected to the second bit line, and a gate connected to a block select signal line, the third memory cell block includes a third block select transistor having a drain connected to one end of the third memory cell block, a source connected to the second bit line, and a gate connected to a block select signal line, and the fourth memory cell block includes a fourth block select transistor having a drain connected to one end of the fourth memory cell block, a source connected to the first bit line, and a gate connected to a block select signal line.

7. The semiconductor memory device according to claim 2, wherein said plurality of unit cells comprises:

a ferroelectric capacitor with two electrodes; and a transistor having a source connected to one of the electrodes of the ferroelectric capacitor, a drain connected to the other of the electrodes of the ferroelectric capacitor, and a gate connected to an associated one of word lines that are included in the word line group.

* * * * *